(12) United States Patent
Niemi

(10) Patent No.: US 9,503,077 B2
(45) Date of Patent: Nov. 22, 2016

(54) BALANCING CURRENTS OF POWER SEMICONDUCTORS

(71) Applicant: ABB OY, Helsinki (FI)

(72) Inventor: Mika Niemi, Helsinki (FI)

(73) Assignee: ABB Technology Oy, Helsinki (FI)

( * ) Notice: Subject to any disclaimer, the term of this patent is extended or adjusted under 35 U.S.C. 154(b) by 163 days.

(21) Appl. No.: 14/564,766

(22) Filed: Dec. 9, 2014

(65) Prior Publication Data

US 2015/0180468 A1 Jun. 25, 2015

(30) Foreign Application Priority Data

Dec. 20, 2013 (EP) .................................... 13198826

(51) Int. Cl.
*H03K 17/06* (2006.01)
*H03K 17/66* (2006.01)
*H03K 17/082* (2006.01)
*H03K 17/12* (2006.01)

(52) U.S. Cl.
CPC ............ *H03K 17/66* (2013.01); *H03K 17/082* (2013.01); *H03K 17/12* (2013.01)

(58) Field of Classification Search
CPC ...................................................... H03K 17/06
See application file for complete search history.

(56) References Cited

U.S. PATENT DOCUMENTS

| | | | |
|---|---|---|---|
| 6,021,057 A | 2/2000 | Linden et al. | |
| 8,575,992 B2 * | 11/2013 | Tanji | H03K 17/007 327/344 |
| 8,633,774 B2 * | 1/2014 | Wood | H03B 5/1852 327/292 |
| 8,963,585 B2 * | 2/2015 | Lobsiger | 323/285 |
| 2004/0056646 A1 | 3/2004 | Thalheim | |
| 2011/0267854 A1 | 11/2011 | Flannery et al. | |
| 2012/0043994 A1 | 2/2012 | Alvarez Valenzuela et al. | |

(Continued)

FOREIGN PATENT DOCUMENTS

DE 196 20 442 A1 11/1997
EP 2 424 112 A1 2/2012

(Continued)

OTHER PUBLICATIONS

European Search Report mailed on Apr. 24, 2014 for Application No. EP 13198826.3.

*Primary Examiner* — Hai L Nguyen

(74) *Attorney, Agent, or Firm* — Taft Stettinius & Hollister LLP

(57) ABSTRACT

An exemplary method and arrangement for balancing currents of power semiconductors. The arrangement including multiple power semiconductor units and a central control unit. Each power semiconductor unit includes a power semiconductor and the central control unit and the power semiconductor units are arranged in a bi-directional ring, in which the central control unit sends control information for the power semiconductor units in both directions in the bi-directional ring and each power semiconductor unit receives the control information in both directions and forwards the received control information. Each power semiconductor unit configured to receive the control information from the first direction at a first time instant, receive the control information from the second direction at a second time instant, calculate a midpoint between the first and the second time instants, and control the power semiconductor component according to the control information after a time delay after the calculated midpoint has elapsed.

13 Claims, 3 Drawing Sheets

(56) References Cited

U.S. PATENT DOCUMENTS

2012/0098577 A1 4/2012 Lobsiger et al.
2012/0224492 A1 9/2012 Kitayama et al.
2013/0328599 A1 12/2013 Lobsiger et al.

FOREIGN PATENT DOCUMENTS

EP         2 445 110 A1    4/2012
WO    WO 02/052726 A1    7/2002

* cited by examiner

BALANCING CURRENTS OF POWER SEMICONDUCTORS

RELATED APPLICATION(S)

This application claims priority under 35 U.S.C. §119 to European application No. 13198826.3 filed in Europe on Dec. 20, 2013, the content of which is hereby incorporated by reference in its entirety.

FIELD

The present disclosure relates to control of power semiconductor components, and more specifically to balancing currents of power semiconductors.

BACKGROUND INFORMATION

Power semiconductors such as IGBT's are used for switching electrical current on and off in different devices, such as converters, inverters and frequency converters. If the specified current is very high or scalability and modularity are called for, several such devices can be controlled in parallel.

In these cases, problems can arise with current balancing between different parallel branches. If, because of differences in individual power semiconductors, one semiconductor turns on earlier than the other, it is subjected to more stress than the other.

One method to prevent this is to provide a separate output filter, e.g., an inductor or a filter, for each power semiconductor and combine the currents after the filter. The problems in this approach are cost, complexity and possible resonance issues.

Another approach is to control all variables of the different branches to be as equal as possible. In practice this would mean measuring and choosing similar power semiconductors and having similar regulated gate control voltages for each controlled component. The choosing of matching semiconductors adds costs and produces difficulties if one of the semiconductors should be replaced later.

Another approach is to measure separately the current of each branch having very good dynamic performance. Turn-on and turn-off times can then be fine-tuned for each branch by changing the timing of the switching so that each branch switches simultaneously.

One solution for distributing the timing information is to deliver the time of an actual current change from each power semiconductor unit (PSU) to the central control unit (CCU). Each power semiconductor unit thus measures the actual time instant of the state change and sends this information to the central control unit. The central control unit controls the power semiconductors by sending control information to the power semiconductor units. In a known structure the CCU fine-adjusts the timing information separately for each of the power semiconductors for both turn-on and turn-off.

In another solution the power semiconductor units communicate to each other their delays for finding the slowest unit. Once the slowest unit is found, each PSU increases its delay such that simultaneous switching is achieved. However, the communication between the different PSU's adds to the complexity of the system.

Various network topologies exist for distributing the timing information. When a star topology with the CCU as central node is used, each PSU receives the timing information at different times due to variations in the communication delays between different units. As an alternative to the star topology, a traditional chain or ring topology could be formed. This is to say that the route for timing information is CCU->PSU_1->PSU_2-> . . . ->PSU_n, n being the number of power semiconductor units. In a chain topology the delay for different PSU's is always different and increases towards the end of the chain or ring.

The known systems of distributing timing information use somewhat complex communication even between the power semiconductor units and call for a calculation that is dependent on the delays of other units.

SUMMARY

An exemplary method for balancing currents is disclosed. The method being performed in an arrangement having multiple power semiconductor units and a central control unit, each power semiconductor unit having a power semiconductor and the central control unit and the power semiconductor units being arranged in a bi-directional ring, the method comprising: at the central control unit:sending, control information for the power semiconductor units to both directions in the bi-directional ring; and at each power semiconductor unit: receiving the control information from both directions which includes: receiving the control information from a first direction at a first time instant; receiving the control information from a second direction at a second time instant; calculating the midpoint between the first and the second time instants; and controlling the power semiconductor component according to the control information after a time delay after the calculated midpoint has elapsed; and forwarding the received control information.

An exemplary arrangement for balancing currents of power semiconductors is disclosed comprising: multiple power semiconductor units; and a central control unit, wherein each power semiconductor unit includes a power semiconductor and the central control unit and the power semiconductor units are arranged in a bi-directional ring, wherein the central control unit is configured to send control information for the power semiconductor units in both directions in the bi-directional ring and each power semiconductor unit receives the control information from both directions and forwards the received control information, and wherein power semiconductor unit is configured to include: means for receiving the control information from a first direction at a first time instant; means for receiving the control information from a second direction at a second time instant; means for calculating a midpoint between the first and the second time instants; and means for controlling the power semiconductor component according to the control information after a time delay after the calculated midpoint has elapsed.

BRIEF DESCRIPTION OF THE DRAWINGS

In the following the disclosure will be described in greater detail by means of exemplary embodiments with reference to the accompanying drawings, in which.

DETAILED DESCRIPTION

Exemplary embodiments of the present disclosure provide a communications system and a communications method in which the communications system forms a bi-directional ring in which a central control unit and plurality of power semiconductor units are connected in a ring-shaped communications structure. The central control unit sends control information to two power semiconductor units. The semiconductor units forward the control information they receive. When the control information from both directions of the ring is received at each power semiconductor unit, each of the power semiconductor units calculates a suitable time instant for performing the control operation based on the instants at which the control information from both directions was received.

Exemplary methods and systems of the disclosure provide that the power semiconductor units do not have to communicate any delay times to other power semiconductor units or to the central control unit for synchronizing the operation of the power semiconductors. Thus the communications between the units is simplified and accurate parallel operation between separate power semiconductors is obtained.

Figure 1:
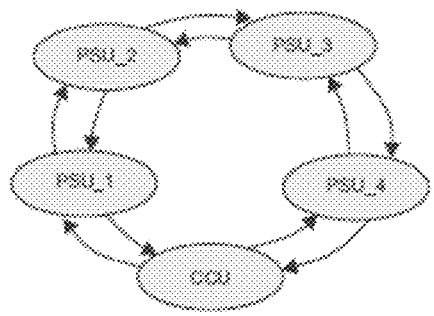
FIG. 1 shows an example of a communications topology in accordance with an exemplary embodiment of the present disclosure.

FIG. 1 shows an example of a communications topology in accordance with an exemplary embodiment of the present disclosure. In this topology one central control unit (CCU) sends control information to a plurality of power semiconductor units (PSU's). The central control unit is responsible for sending control information, such as turn-on or turn-off of the power semiconductor. The central control unit described herein is capable of sending the control information to two power semiconductor units. For example, the control information can include a timing mark and an information part. The timing mark can be a digital pulse sequence and, similarly, the information part can be a digital pulse sequence that can be interpreted by the power semiconductor unit. The control information can also include some other data.

As shown in FIG. 1, the central control unit and power semiconductor units are arranged in a bi-directional ring-like communications structure. This structure establishes that the central control unit is connected to two power semiconductor units over a communications link and each power semiconductor unit is connected to two neighbouring units. As seen in FIG. 1, central control unit CCU is connected to power semiconductor units PSU_1 and PSU_4. The example of FIG. 1 includes four PSU's and each PSU is part of the bi-directional ring such that a communication path from CCU to all the PSU's is formed in both directions of the ring. The bi-directional communications connection or link between the units can be formed of two separate communications paths or from a single communications path that enables to communicate in both directions at the same time.

When the central control unit (CCU) in the structure of FIG. 1 sends control information, the information is sent at the same time to both directions of the bi-directional ring. This means that the same information is sent both to power semiconductor unit PSU_1 and power semiconductor unit PSU_4. Both units receive the information and forward it to the neighboring PSU's, that is PSU_1 forwards the control information to PSU_2 and PSU_4 forwards the control information to PSU_3. The control information is received and forwarded by the other units, and finally the control information is forwarded back to the central control unit PSU. The control information send by the central control unit thus travels through all the power semiconductor units in both directions of the bi-directionally constructed communications path.

The power semiconductor units used in the disclosure are adapted to receive and forward received control information. As the control information is received by a PSU, the PSU forwards the control information and interprets the information. As mentioned above, the control information can be formed of digital pulses, and is received as a message or a package. Each PSU includes means that are suitable for interpreting the control information, such as a processor or other suitable processing or computing device. The power semiconductor unit includes the power semiconductor, and the control information received by the PSU relates to controlling the component, for example, turn-on or turn-off the component. For switching the component, the power semiconductor unit includes also means for generating a gate signal.

According to an exemplary method of the present disclosure, each power semiconductor unit receives control information from a first direction of the bi-directional ring and from a second direction of the bi-directional ring. Each PSU calculates a time difference between the control information received from both directions. For example, if the first received control information is received at time instant T_1 and the second received control information is received at time instant T_2, then the difference between the time instants is T_2−T_1. The time difference can be calculated for example by starting a timer when the first control information is received.

After the control information is received from both directions, each power semiconductor unit calculates the midpoint T_IN between the first and second time instants. If a timer is used, as explained above, then the second time instant T_2, e.g., the value of the timer when the later control information is received, is divided by two.

Further in the method, each power semiconductor unit controls the power semiconductor of the unit according to the control information after a time delay T_ADD starting from the calculated midpoint T_IN has elapsed. Each power semiconductor unit has thus a set time delay T_ADD, and each PSU controls its power semiconductor after the time T_ADD starting from the calculated midpoint has expired.

Thus in the method, each PSU receives control information from both directions, and calculates a temporal midpoint between the two received control information items. When the midpoint is calculated, a time delay is added to the midpoint. After the time delay has elapsed, each semiconductor unit controls the semiconductor component.

Figure 2:
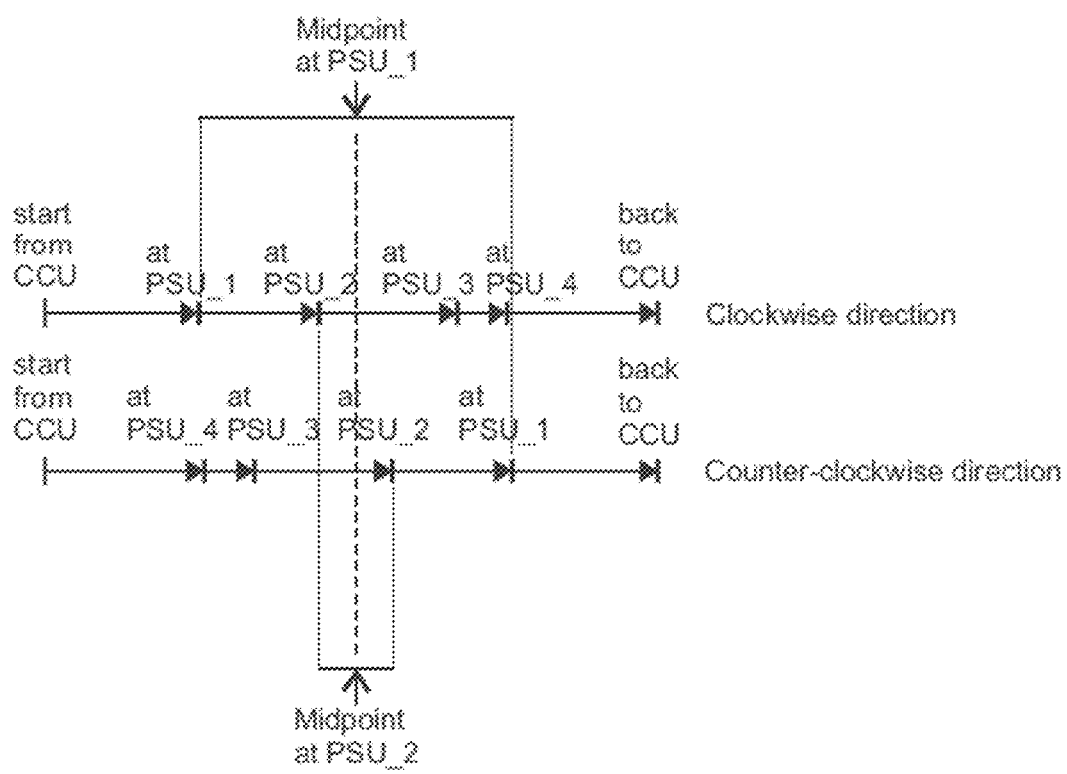
FIG. 2 shows timelines of the disclosure for calculating a middle point of received timing marks in accordance with an exemplary embodiment of the present disclosure.

FIG. 2 shows timelines of the disclosure for calculating a middle point of received timing marks in accordance with an exemplary embodiment of the present disclosure. Namely, FIG. 2 illustrates control information in timelines sent by CCU to the two directions of the bi-directional ring. The timelines show the instants in time at which the control information is received by PSUs. FIG. 2, for example, shows the time instants when the control information is received at PSU_1 and at PSU_2. It can be seen that the midpoint between the time instants when the control information is received by PSU_1 is the same as the midpoint between the time instants the control information is received by PSU_2. Similarly, the midpoint between the time instant is the same for all PSUs in the ring.

This can be shown mathematically by defining the message paths in rings of four power semiconductor units to be as follows:

CCU->PSU_1->PSU_2->PSU_3->PSU_4->CCU
CCU->PSU_4->PSU_3->PSU_2->PSU_1->CCU.

The delay from CCU to PSU_3 in one direction is defined as a sum of the delays between nodes or units, e.g., $T\_DEL_1+T\_DEL_2+T\_DEL_3$, and, in the other direction, $T\_DEL_5+T\_DEL_4$. The middle point between these two delays can be presented as $$\frac{T\_DEL_1 + T\_DEL_2 + T\_DEL_3 + T\_DEL_4 + T\_DEL_5}{2}$$

It can be seen from the above equation that this middle point between the two arrival times from different directions of the ring is the same for all the nodes or units regardless of the possibly differing delays $T\_DEL_i$. For this reason the time instants in the middle of the two received control information items are temporally at the same point in all of the PSUs in the ring.

If the internal control delays are equal in each power semiconductor unit, each power semiconductor turns on or turns off simultaneously according to received control information. According to an exemplary embodiment of the present disclosure, because power semiconductors can have differing delays, each power semiconductor unit can include measurement means for measuring the time instant of the actual current change. This means that after the gate signal is generated in the PSU, time is measured in the PSU from the gate signal to the actual change of current. Thus the current of the power semiconductor is measured in the power semiconductor unit. The measured current is compared to a threshold value and, based on the comparison, the change of current is detected.

According to an exemplary embodiment of the present disclosure, the time instant of the actual state change of the power semiconductor component is detected in each power semiconductor module. If the time instant of the state change differs from a set value of constant maximum delay T_MAX measured from the calculated midpoint T_IN between the first and second time instants, then the value of time delay T_ADD is changed. Constant maximum delay T_MAX is the time instant when the power semiconductors are specified to change their states. The value of the maximum delay is set such that the delays of practically all power semiconductors are smaller than the maximum delay.

When the power semiconductor is triggered at time instant T_ADD calculated from the midpoint T_IN, the delay from the triggering to the actual state change is T_VAR, and the sum of these times (T_ADD+T_VAR) should equal T_MAX in all controlled components in the bi-directional ring. If the state change is detected at an earlier time instant than T_MAX, then the value of T_ADD is increased, and if the state change takes place after time instant T_MAX, then the value of T_ADD is decreased.

Figure 3:
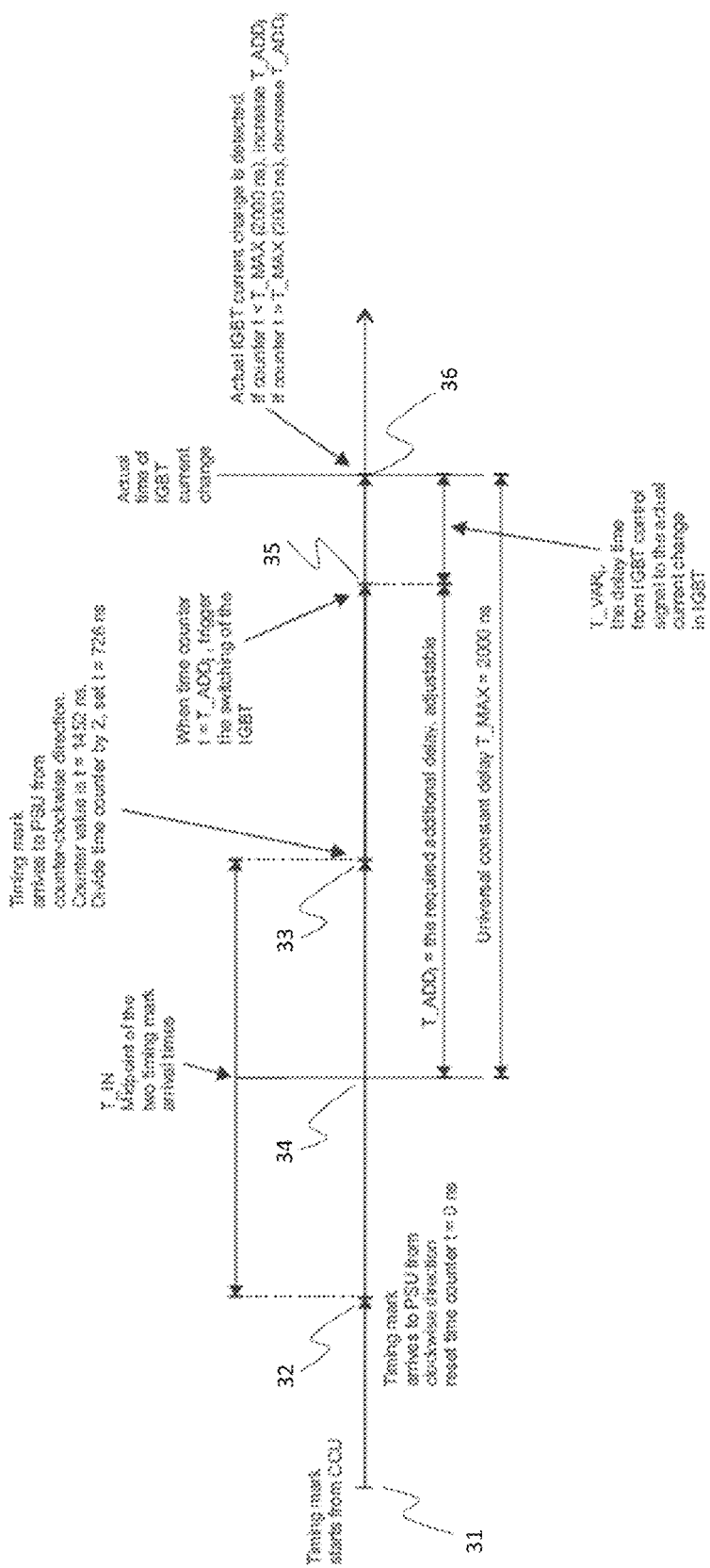
FIG. 3 shows a timeline describing the operation of a communications topology in accordance with an exemplary embodiment of the present disclosure.

FIG. 3 shows a timeline describing the operation of a communications topology in accordance with an exemplary embodiment of the present disclosure. At the start of the timeline, control information with a timing mark is sent from CCU 31. Timing mark is received 32 by the PSU from the first direction (clockwise), and a timer is reset in the PSU.

Further, a timing mark is received 33 by PSU from the second direction (counter-clockwise). In the example of FIG. 3, as the second timing mark is received, the value of the counter is read (t=1352 ns), and the value of the counter is divided by two, and the timer value is set to the obtained value (726 ns).

FIG. 3 shows also the midpoint T_IN of the two timing mark arrival times 34, which in the example is 726 ns, and the specified additional delay T_ADDi starting from the mentioned midpoint T_IN, together with constant delay T_MAX also starting from the midpoint T_IN. In the example, the value of the constant delay is set to 2000 ns.

When the counter reaches the value of T_ADDi, the PSU triggers the switching of the semiconductor component, such as an IGBT. According to the embodiment, PSU further detects 36 the actual state change of the controlled component and the value of the timer at the time of state change. If the state change occurs prior to the constant delay T_MAX, then the value of T_ADDi is increased and if the state changes after the constant delay, the value of T_ADDi is decreased.

Figure 4:
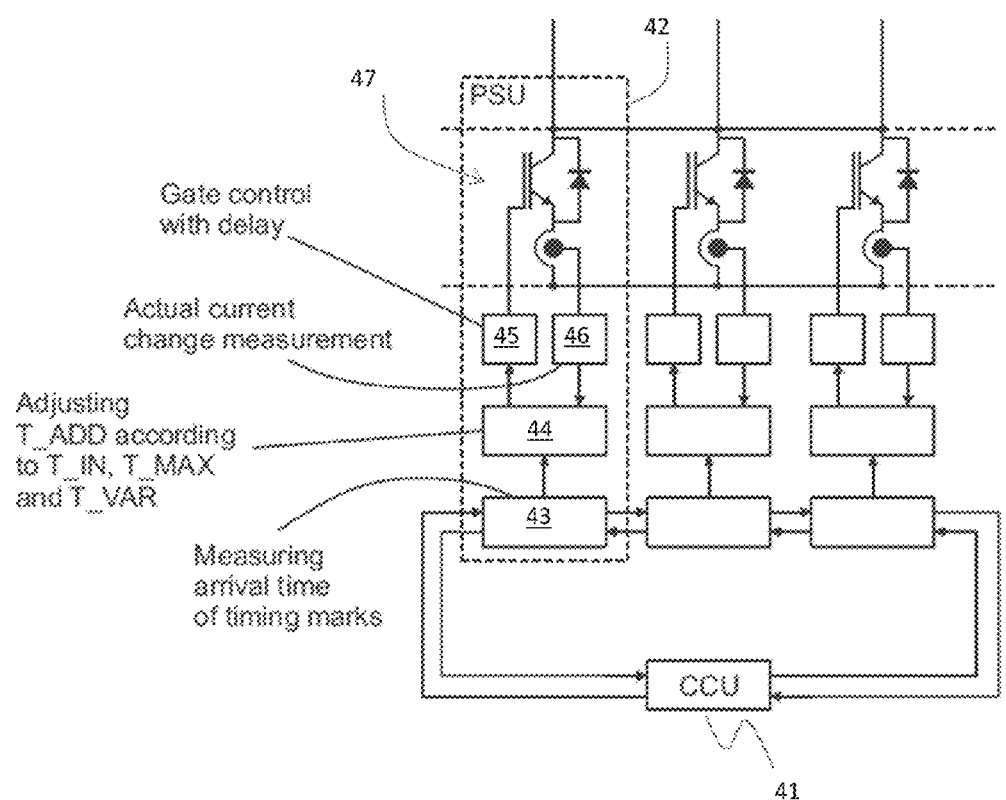
FIG. 4 shows a simplified block diagram of a communications topology having power supply units and a central control unit in accordance with an exemplary embodiment of the present disclosure.

In the example of FIG. 4, the value of the counter is changed after two timing marks are received by PSU. The method can also be carried out by adding half of the time difference T_IN between the received timing marks to both the specified additional delay T_ADDi and constant delay T_MAX and leaving the counter running in a continuous manner while using such modified values of delays.

As each power semiconductor unit carries out the above steps and each power semiconductor unit has the same value of constant delay T_MAX, each PSU will change its own triggering such that all of the power semiconductors are switched on or off simultaneously. The above referred timing mark is included in the control information sent by the central control unit.

The turn-on and turn-off delays of a power semiconductor unit can be different. In an embodiment each power semiconductor unit includes additional delays T_ADD for both turn-on and turn-off. This is to say that when control information includes a command for triggering the power semiconductor component conductive, the PSU then chooses value for T_ADD used in turn-on. Similarly, if the control information includes a command for triggering the power semiconductor component into a blocking state, the PSU chooses a value for T_ADD to be used in turn-off.

As the value of the additional delay T_ADD is changed during the operation, the changed value is stored in the power semiconductor unit during the use. Further, if separate values are used for turn-on and turn-off, these values are stored in the PSU and read from the memory when specified in the operation.

FIG. 4 shows a simplified block diagram of a communications topology having power supply units and a central control unit in accordance with an exemplary embodiment of the present disclosure. As mentioned above, central control unit CCU 41 sends control information in both directions of a bi-directional ring. In the example of FIG. 4, three power semiconductor units PSU 42 are connected to the same ring and are intended to be controlled simultaneously. Each PSU is similarly structured. The control information is received by communications unit 43, which in the embodiment is also adapted to calculate the midpoint T_IN between the received timing marks and to send the calculated midpoint to adjusting unit 44. The adjusting unit is responsible for changing the value of additional delay T_ADD based on information received from current measurement unit 46 and for setting the value of constant delay T_MAX.

The example also includes a gate control unit 45, which controls the semiconductor component 47 according to the control information at the delayed time instant. The gate control unit can receive the value of the delay added to T_IN and control the gate after the time from the midpoint T_IN has elapsed. The gate control unit can also be a unit operating immediately on the basis of the incoming control signal, in which case the trigger signal is delayed in block 44. In FIG. 4 the counter used in defining the delays and operations is not shown. However, it is clear that a counter can provide information to multiple units and one or more of the units are also able to reset the counter.

The exemplary embodiment of FIG. 4 is provided for understanding the operation of the disclosure and the structural division of the block diagram does not limit the implementation of the power semiconductor unit. A power semiconductor unit can be formed of a communications unit, processing unit processing the specified information, gate control unit for controlling the component and current measurement unit for providing state information. The gate control unit further includes all expected arrangements which enable control of the power semiconductor component.

According to an exemplary embodiment of the present disclosure, the delay (T_ADD) is changed based on a comparison between the desired maximum delay and the actual state change. The delay can be changed by adding or subtracting a constant value to or from the value of the delay (T_ADD) used in the previous switching. Further, the delay can be changed by correcting the delay directly to a value which would be correct if the switching occurred similarly as in the previous switching. For example, if the maximum limit is exceeded by X ns, then the delay T_ADD is reduced by the same amount. If in the next switching the internal delay of the device from the triggering to the actual state change is the same as the previous one, then the next state change would take place exactly at the desired time instant.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method for balancing currents in an arrangement having multiple power semiconductor units and a central control unit, each power semiconductor unit having a power semiconductor and the central control unit and the power semiconductor units being arranged in a bi-directional ring, the method comprising:
   at the central control unit:
      sending, control information for the power semiconductor units to both directions in the bi-directional ring; and
   at each power semiconductor unit:
      receiving the control information from both directions which includes:
         receiving the control information from a first direction at a first time instant;
         receiving the control information from a second direction at a second time instant;
         calculating the midpoint between the first and the second time instants; and
      controlling the power semiconductor component according to the control information after a time delay after the calculated midpoint has elapsed; and
      forwarding the received control information.

2. The method according to claim 1, wherein each power semiconductor unit further includes means for determining the time instant at which the current of the power semiconductor changes, in which method each power semiconductor unit executes the steps of:
   setting a constant delay;
   detecting a time instant of an actual state change of the power semiconductor component; and
   changing a value of the time delay if the time instant of the actual state change differs from a value of constant delay measured from the calculated midpoint between the first and second time instants.

3. The method according to claim 2, wherein the step of calculating the midpoint between the first and second time instants includes:
   starting a counter at the first time instant; and
   dividing the value of the counter by two at the second time instant for obtaining the midpoint between the first and the second time instants.

4. The method according to claim 2, wherein separate values of time delay are used for turn-on and turn-off.

5. The method according to claim 2, wherein the step of changing the value of the delay includes subtracting a set value from or adding a set value to the previous value of the delay.

6. The method according to claim 5, wherein the set value depends on the difference between the value of the counter at the detected time instant of the actual state change.

7. The method according to claim 1, wherein separate values of time delay are used for turn-on and turn-off.

8. The method according to claim 1, wherein the step of calculating the midpoint between the first and second time instants includes:
   starting a counter at the first time instant; and
   dividing the value of the counter by two at the second time instant for obtaining the midpoint between the first and the second time instants.

9. The method according to claim 8, wherein separate values of time delay are used for turn-on and turn-off.

10. The method according to claim 8, wherein the step of controlling the power semiconductor component according to control information after a time delay after the calculated midpoint has elapsed includes:
   setting a value of the counter to a value corresponding to the value of the calculated midpoint,
   triggering the power semiconductor component when the value of the counter corresponds to the time delay.

11. The method according to claim 8, wherein the step of controlling the power semiconductor component according to control information after a time delay after the calculated midpoint has elapsed includes:
   modifying the time delay by adding the value of the calculated midpoint to the time delay; and
   triggering the power semiconductor component when the value of the counter corresponds to the time delay.

12. The method according to claim 8, wherein the step of changing the value of the delay includes subtracting a set value from or adding a set value to the previous value of the delay.

13. An arrangement for balancing currents of power semiconductors comprising:
multiple power semiconductor units; and
a central control unit,
wherein each power semiconductor unit includes a power semiconductor and the central control unit and the power semiconductor units are arranged in a bi-directional ring,
wherein the central control unit is configured to send control information for the power semiconductor units in both directions in the bi-directional ring and each power semiconductor unit receives the control information from both directions and forwards the received control information, and
wherein power semiconductor unit is configured to include:
means for receiving the control information from a first direction at a first time instant;
means for receiving the control information from a second direction at a second time instant;
means for calculating a midpoint between the first and the second time instants; and
means for controlling the power semiconductor component according to the control information after a time delay after the calculated midpoint has elapsed.

* * * * *